(12) United States Patent
Wong et al.

(10) Patent No.: US 6,723,600 B2
(45) Date of Patent: Apr. 20, 2004

(54) METHOD FOR MAKING A METAL-INSULATOR-METAL CAPACITOR USING PLATE-THROUGH MASK TECHNIQUES

(75) Inventors: Kwong H. Wong, Wappingers Falls, NY (US); Xian J. Ning, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 09/837,805

(22) Filed: Apr. 18, 2001

(65) Prior Publication Data

US 2002/0153551 A1 Oct. 24, 2002

(51) Int. Cl.[7] .................. H01L 21/8242; H01L 21/20; H01L 21/4763
(52) U.S. Cl. .................. 438/244; 438/253; 438/387; 438/626
(58) Field of Search .................. 257/301, 303, 257/306, 532, 534, 751, 752, 753, 761, 762, 763; 438/243, 244, 253, 386, 387, 396, 626, 627, 631, 643, 645, 683, 685, 688

(56) References Cited

U.S. PATENT DOCUMENTS

| | | | |
|---|---|---|---|
| 5,654,581 A | * 8/1997 | Radosevich et al. | 257/534 |
| 6,117,747 A | 9/2000 | Shao et al. | 438/396 |
| 6,144,051 A | 11/2000 | Nishimura et al. | 257/277 |
| 6,159,793 A | 12/2000 | Lou | 438/255 |
| 6,174,804 B1 | 1/2001 | Hsu | 438/638 |
| 6,174,812 B1 | 1/2001 | Hsiung et al. | 438/687 |
| 6,329,234 B1 | * 12/2001 | Ma et al. | 257/301 |
| 6,335,557 B1 | * 1/2002 | Kizilyalli et al. | 257/532 |
| 6,346,454 B1 | * 2/2002 | Sung et al. | 438/396 |
| 6,433,379 B1 | * 8/2002 | Lopatin et al. | 257/301 |

OTHER PUBLICATIONS

P. Wrschka et al., "Chemical Mechanical Planarization of Copper Damascene Structures", Journal of the Electrochemical Society, 147 (2) 706–712, (2000).

M. Armacost, et al., "A High Reliability Metal Insulator Metal Capacitor for 0.18 $\mu$m Copper Technology", Technical Digest, IEDM 2000 San Francisco, pp. 1–4.

K.K. H. Wong et al., "Metallization By Plating For High–Performance Multichip Modules", IBM Journal of Research and Development, vol. 42, No. 5, Sep. 1998, pp. 587–596.

* cited by examiner

*Primary Examiner*—Hung Vu
(74) *Attorney, Agent, or Firm*—Jay H. Anderson

(57) ABSTRACT

A method for making a metal-insulator-metal capacitive structure includes depositing a copper barrier and seed layer over a support structure such as an inter-level dielectric layer, forming a dielectric over the copper barrier and seed layer, and then forming a forming a metal layer over the dielectric. The copper barrier and seed layer forms a bottom plate of a capacitor, and the metal layer forms the upper plate which is separated from the bottom plate by the dielectric. By forming the bottom plate from a copper barrier and seed layer, reduced sheet resistance and surface roughness is achieved, both of which enhance the performance of the capacitor. This performance is further enhanced by forming the capacitor to have a damascene structure. Preferably, at least one conductive interconnect is formed simultaneously with the formation of the capacitor. This is made possible, at least in part, by forming the interconnect using a plate-through mask technique. The interconnect and capacitor are then finished using one and only one planarizing (e.g., CMP) step. The result is to form a capacitor and interconnect structure in far fewer steps than conventionally required, which translates into improved cost and efficiency.

8 Claims, 3 Drawing Sheets

METHOD FOR MAKING A METAL-INSULATOR-METAL CAPACITOR USING PLATE-THROUGH MASK TECHNIQUES

BACKGROUND OF THE INVENTION

1. Field of the Invention

This invention generally relates to semiconductor device fabrication, and more particularly to a method for making a metal-insulator-metal capacitor having a damascene structure which may be used, for example, in back end of the line (BEOL) integrated circuits.

2. Description of the Related Art

Various capacitive structures are used in integrated circuits. These structures include metal-oxide-semiconductor (MOS) capacitors, p-n junction capacitors, and metal-insulator-metal (MIM) capacitors. For some applications, MIM capacitors provide certain advantages over MOS and p-n junction capacitors because the frequency characteristics of MOS and p-n junction capacitors are restricted as a result of depletion layers that form in the semiconductor electrodes. MIM capacitors, on the other hand, are preferential because they exhibit improved frequency and temperature characteristics. Also, MIM capacitors are formed in the metal interconnect layers which reduce CMOS transistor process integration interactions or complications. Additionally, the topology of a MIM capacitor simplifies planarization processes.

In spite of their advantages, conventional methods for making metal-insulator-metal (MIM) capacitors are undesirable in a number of respects. For example, conventional methods perform multiple masking, etching, and polishing steps in order to form the capacitor plates and dielectric. This typically involves performing three masking steps to form the plates and dielectric elements of the capacitor. This is accompanied by three separate reactive ion etching steps, each of which is followed by a cleaning step to prevent contamination. These steps, when repetitively performed, increase the time, cost, and complexity of the manufacturing process.

In order to electrically connect the capacitor to other elements of the circuit, it is clear that some form of wiring must be formed near the capacitor. Conventional methods usually form this wiring after the capacitor has been formed. The use of separate process steps to form this wiring has also proven adverse to process efficiency.

Moreover, this wiring is conventionally located on a level of the device different from the capacitor level. This adversely impacts the integration density of the device.

Structurally speaking, MIM capacitors have traditionally used aluminum as the metal for their conductive plates. This use of aluminum has proven to be undesirable for a number of reasons, not the least of which include the high sheet resistance and surface roughness that results from the use of this metal. Both of these effects adversely impacts device performance and thus are highly undesirable.

Efforts have been made to use more favorable materials in integrated circuit design. Most recently, copper has been used to form interconnects structures for multi-layer semiconductor devices. U.S. Pat. No. 6,117,747 discloses one such technique where the upper and lower plates of a metal-oxide-metal capacitor are connected to other circuit elements using dual damascene copper interconnects and metal lines. In spite of the use of copper, this device is still undesirable because the aluminum is used to form the capacitor plates and thus this device has all of the previously mentioned drawbacks associated with the use of this metal. Furthermore, using aluminum in a copper interconnect integration scheme substantially increases the overall time of manufacture because additional process steps of deposition, patterning and etching are required. U.S. Patent Nos. 6,174,812 and 6,174,804 also disclose methods for forming copper interconnects in integrated circuit devices.

In view of the foregoing, it is cleat that a need exists for a method of making a MIM capacitor which uses fewer process steps than conventional methods, thereby improving manufacturing efficiency in terms of time, cost, and complexity. There is also a need for a MIM capacitor which is formed from materials that demonstrate improved performance compared with conventional capacitor materials.

SUMMARY OF THE INVENTION

It is one object of the present invention to provide a method of making a MIM capacitor which uses fewer process steps than conventional methods, thereby improving the time, cost, and complexity of the device manufacturing process.

It is another object of the present invention to achieve the first object by forming the capacitor and the wiring for the capacitor at the same time and on the same level of the device, thereby providing the dual advantage of reducing the time of manufacture and increasing integration density.

It is another object of the present invention to form the wiring using plate-through mask techniques, which techniques advantageously prevent the metal material used to form the conductive interconnects from falling into and thus contaminating the unfinished layers of the capacitor during simultaneousy capacitor formation.

It is another object of the present invention to achieve the first object by reducing the number of masking, etching, and polishing steps required to form the capacitor.

It is another object of the present invention to provide an MIM capacitor constructed from materials that demonstrate improved performance compared with conventional capacitors, which materials include conductive plates formed from copper which is cheaper, more efficient, and demonstrates a greater ability to hold a charge than metals used to for the conductive plates in conventional capacitors. Copper conductive plates also have lower sheet resistance and improved surface smoothness, both of which further contribute to improved performance of the capacitor.

It is another object of the present invention to provide an MIM capacitor with the aforementioned features formed from one of a single- or dual-damascene processes which advantageously further improves performance and integration density.

It is another object of the present invention to provide an MIM capacitor with the aforementioned features having an open-box shape.

The foregoing and other objects of the invention are achieved by providing a method which includes depositing a copper barrier and seed layer over support structure such as an inter-level dielectric layer, forming a dielectric over the copper barrier and seed layer, and then forming a forming a metal layer over the dielectric.

The copper barrier and seed layer forms a bottom plate of a capacitor, and the metal layer forms the upper plate which is separated from the bottom plate by the dielectric. By forming the bottom plate from a copper barrier and seed layer, the capacitor of the claimed invention achieves enhanced performance. This performance is only further enhanced by forming the capacitor to have a damascene structure.

In accordance with a preferred embodiment of the method of the present invention, at least one conductive interconnect is formed simultaneously with the capacitor. This is made possible by forming the interconnect in a via adjacent a trench in which the capacitor is formed. The copper barrier and seed layer is then deposited simultaneously in the trench and via. A photoresist is then placed in the trench and the via is electroplated with copper to form a stud that will form the interconnect. The resist is then removed and the dielectric and upper plate layers of the capacitor are deposited. This is followed by a planarizing step which ensures that top surfaces of the capacitor and stud (now an interconnect) are at an even level. Simultaneously forming the capacitor and interconnect in this manner reduces the time, cost, and complexity of the manufacturing process compared with conventional methods. The method also forms a capacitive structure having an open-box shape with increased integration density and improved capacitance.

DESCRIPTION OF THE PREFERRED EMBODIMENTS

Figure 1:
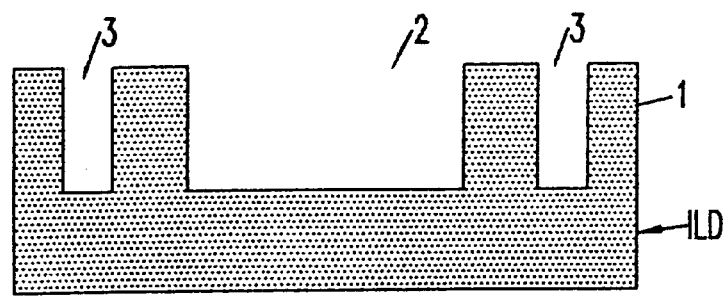
FIG. 1 is a diagram showing an initial step in a preferred embodiment of the method of the present invention where a damascene pattern is formed on a surface of an inter-level dielectric layer.

Referring to FIG. 1, an initial step of a preferred embodiment of the method of the present invention includes forming a damascene pattern on a surface of an inter-level dielectric (ILD) l using, for example, known lithographic and reactive ion etching techniques. The ILD may be made from silicon oxide, florinated silicon oxide, spin-on-glass, SILK, or any other low k dielectric materials available. ILD thickness may varies from 500 to 2000 nm. Oxides of silicon can be deposited by plasma enhanced chemical vapor deposition (PECVD), SILK and some low K dielectric materials can be spin onto the wafers. Exact thickness and choice of dielectric material may be determined by the electrical specification of the MIM Cap, such as capacitance value, leakage current frequency response, and processing constraints of the integration scheme. For example, MIMCAP using SILK as ILD cannot tolerate a process with operating temperature higher than 400 C.

The damascene pattern may be a single-damascene or a dual-damascene pattern depending upon the preference of the manufacturer. As an alternative to reactive ion etching, the surface of the ILD may be patterned with an etch-resistant substance and then exposed to a wet etchant. After etching, the damascene pattern is formed which includes a trench 2 and a number of vias. Two vias 3 are shown by way of illustration. The trench provides the location where the MIM capacitor will be formed and the vias where the conductive studs will be formed. Alternatively, the MIM capacitor may be incorporated into the silicon device layers. However, in this configuration, there is a much limited choice of electrode and dielectric material for possibility of their reaction with silicon changing the electrical characteristics of the devices.

Figure 2:
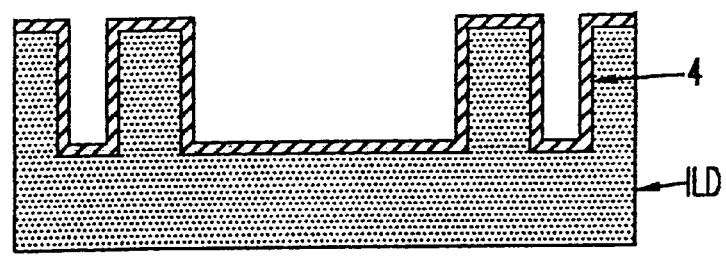
FIG. 2 is a diagram showing a step in the preferred method of the present invention where a copper seed layer is deposited over the damascene pattern on the interlevel dielectric layer.

In a second step, shown in FIG. 2, a copper barrier and seed layer 4 is conformally deposited on a surface of the ILD, including along the bottom and sidewalls of the trench and vias As will be explained in greater detail, the portion of the copper barrier and seed layer formed along the interior of the trench corresponds to the bottom plate of the MIM capacitor. This is an especially advantageous feature of the invention, as the use of a copper barrier/seed layer for the bottom plate lowers sheet resistance and surface roughness, which, in turn, translates into improved capacitor performance. This improved performance, which includes a capacity to store a greater potential, is further enhanced by the damascene pattern formed on the ILD. More specifically, the use of a damascene pattern for capacitor formation is advantageous for a number of reasons. Perhaps most importantly, damascene structures allow at least the lower plate of the capacitor to be formed in a trench of an insulating material. By depositing the lower capacitor plate along the sidewalls of the trench, as well as along the bottom, the effective capacitance of the capacitor is enhanced, because the dimensions of the bottom plate are enhanced compared with traditional capacitor structures which straight capacitor plates. Even more advantageously, this enhanced performance is achieved without increasing the lateral dimensions of the capacitor, thereby increasing the integration density of the chip in which the capacitor is formed.

The Inventors of the present invention have discovered that further improved performance can be achieved by coupling a damascene capacitor structure with the use of a lower capacitor electrode formed from a copper barrier and seed layer, a combination which heretofore was not known or even suggested in the art. Specifically, through this copper barrier and seed layer, the advantages of low sheet resistance and less surface roughness are coupled with the increased effective plate dimensions provided by the damascene structure, thereby producing a capacitor with greater performance characteristics compared with conventional capacitors.

This copper barrier and seed layer 4 is preferably deposited using the same conventional techniques used to form copper wiring. For example, a copper barrier such as TaN or Ta/TaN or Cr, or W or TaSiN with thickness from 50 to 200 A, followed by a 500 to 3000 A of copper seed layer may be deposited by sputtering, reactive co-sputtering (TaN, TaSiN), evaporation or CVD. Deposition conditions used should allow a continuous coverage of the copper barrier and copper seed layer over the side wall of the MIM structure and preferrably to have 20% or more side wall coverage.

Figure 3:
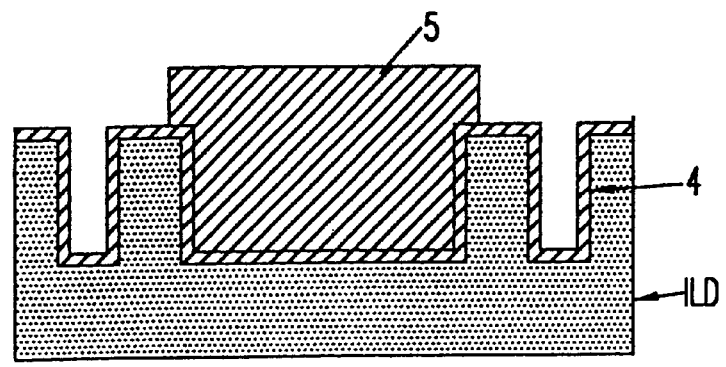
FIG. 3 is a diagram showing a step in the preferred method of the present invention where a photoresist pattern is formed over the copper barrier and seed layer.

In a third step, shown in FIG. 3, a photoresist pattern 5 is formed over the copper barrier and seed layer using lithography techniques. The resist pattern is formed so that it only covers the trench which corresponds to the location of the MIM capacitor, and a surface portion 6 adjacent one of the vias where a conductive stud. Places where copper wiring patterns are to be formed are left uncovered by the resist material, including the interior portions of the vias. In performing this step, any deep UV photoresist which is stable in a strongly acidic copper plating bath can be used. It is preferably spin coated onto the substrate and then hard baked to improve the adhesion and mechanical strength. Resist thickness after hard bake is preferably at least 20% higher than the thickness of the copper features to be plated later in order to avoid overgrowth of plated copper causing mushroom shape features. (In the figure, the surface portion 6 is a partial drawing of a neighbouring MIM Cap.)

Figure 4:
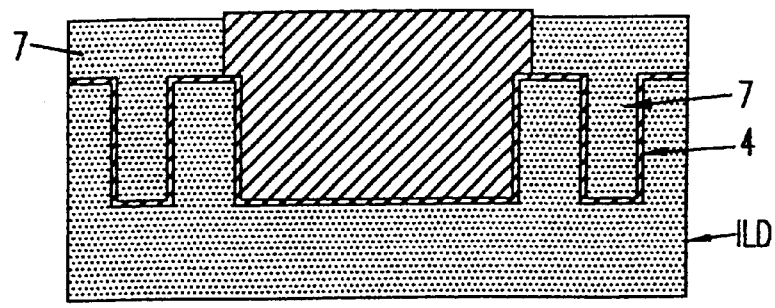
FIG. 4 is a diagram showing a step in the preferred method of the present invention where the vias are filled with electroplated copper that will serve as conductive interconnects or studs for the device.

In a fourth step, shown in FIG. 4, the vias are filled with electroplated copper which will form the basis of interconnects, or conductive studs, for electrically connecting the capacitor. The copper-plated interconnects are preferably formed using plate-through mask techniques, such as described, for example, in IBM J. Res. & Dev., 42, pages 587–596 (1998), the contents of which is incorporated herein by reference. This plate-though mask technique may include the following steps: (a) depositing a thin barrier such as TaN, Ta/TaN, Cr, W, TaSiN and a thin copper seed layer, (b) spinning on and hardbake a layer of photoresist, (c) exposing and developing the photoresist, (d) electroplating copper over the uncovered region of the seed layer to a desirable thickness, (e) removing the resist, and (f) removing the seed layer by wet chemical etching or ion-milling. The barrier thickness can varies from 50 to 200 A, and the copper seed layer thickness can be 500 to conductive 3000 A.

The plate-through mask technique for forming copper-plated interconnects is an especially advantageous feature of the present invention because it significantly simplifies the MIM capacitor build process. Through this technique, the copper seed layer is used in the Damascene build as the bottom electrode. This eliminates the need to implement separate steps to build the bottom electrode. More specifically, in conventional methods, the bottom electrode, dielectric and top electrode are deposited and patterned (litho and etch) separately using three deposition, three lithography and three etching steps. The plate-through mask technique of the present invention, in contrast, requires only the deposition of the dielectric, one lithography for the plating mask, and an additional step of barrier and seed layer removal. The barrier and seed layer deposition, electroplating and CMP are already integral parts of the Damascene copper interconnect fabrication process of the present invention, and thus the present invention inherently has fewer steps.

The result of this plate-through mask technique is to form copper-plated interconnects in the vias that may be used to electrically connect the capacitor, once formed, with other layers or elements of the overall device. In addition to the above-discussed advantages, the plate-through mask technique is preferred because it prevents copper material from falling into the trench (and contaminating the area reserved for the capacitor) during formation of the conductive interconnects. As a result, the present invention is able to simultaneously form a capacitor and at least one adjacent interconnect in the manner to be described below.

Figure 5:
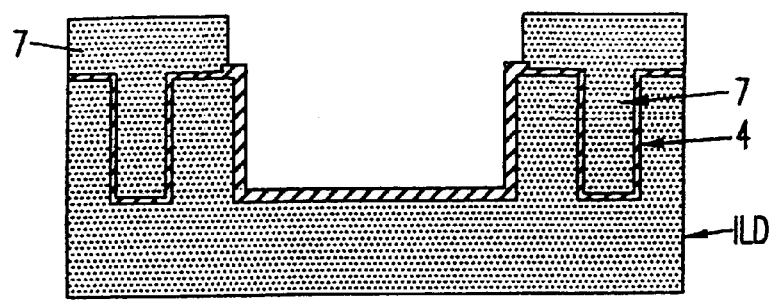
FIG. 5 is a diagram showing the structure that results after the photoresist material is removed and the trench is subjected to a cleaning process.

In a fifth step, shown in FIG. 5, the photoresist material is completely removed from the trench and other portions of the structure. The photoresist can be removed by wet stripping in a commercial resist stripper or a solution of TMAH, or acetone, depending on its chemical nature. Any residual can be completely removed by ashing the sample in a light oxygen plasma In a sixth step, shown in FIG. 6, the remaining layers of the capacitor are formed. This includes the formation of a dielectric layer 8 over the copper barrier and seed layer, as well as over other portions of the structure, using a deposition technique such as PECVD, CVD, PVD, or any other known deposition technique suitable for forming a dielectric. The dielectric layer may be silicon oxide, SiON, BSTO, aluminum oxide, tantalum pentoxide, or any high K and low leaky dielectric material. The dielectric thickness may be between 100 to 1000 A. Silicon oxide, SiON can be deposited by PECVD, BTSO and tantalum pentoxide by sputtering.

After dielectric layer 8 is formed, metal layer 9 is deposited over the dielectric layer by known techniques, including but not limited to CVD, PVD, evaporation, plating, or a combination thereof The metal layer may be formed from W, Ti, TiW, TiN, Ta, TaN, Al, Cu, or any other conductive material. The top electrode should have good adhesion to the dielectric and should not affect its electrical characteristics during and after its deposition. Preferably, the thickness of the top metal plate varies between 300 to 1000 A. The deposition conditions used should allow for continuous coverage of the metal layer over the side wall of the MIM structure and preferably 20% or more side wall coverage.

Figure 6:
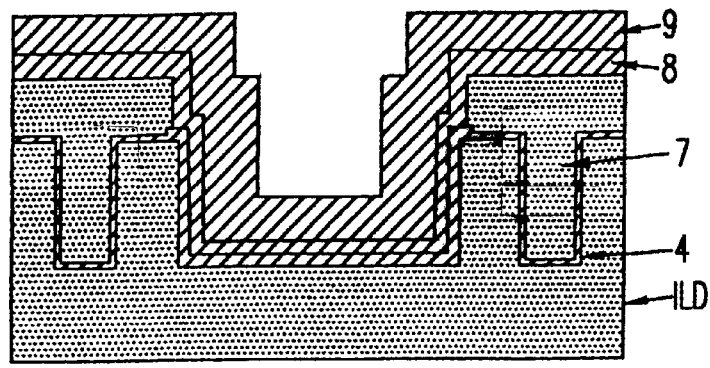
FIG. 6 is a diagram showing a step in the preferred method of the present invention where the dielectric and upper plate of the capacitor are formed.
Figure 7:
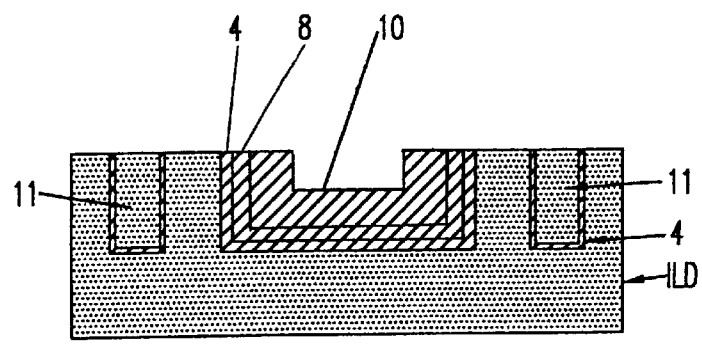
FIG. 7 is a diagram showing a step in the preferred method of the present invention where the top metal plate layer and dielectric layer are removed from all portions of the structure, except the area within the trench.
Figure 8A:
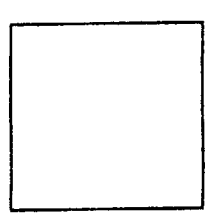
FIGS. 8(a)–(d) are diagrams showing alternative shapes for the capacitor of the present invention.
Figure 8B:
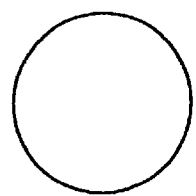
Figure 8C:
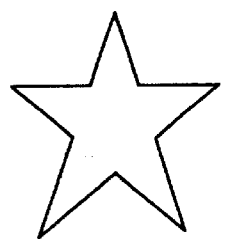
Figure 8D:
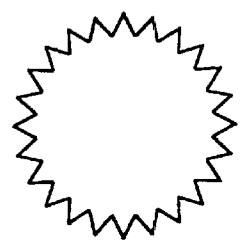

In a seventh step, shown in FIG. 7, the surface of the structure shown in FIG. 6 is planarized so that what is left of metal layer 9 forms the upper plate 10 of the capacitor. This planarizing step preferably includes performing chemical metal polishing (CMP) to remove dielectric layer 8 and metal layer 9 from all portions of the structure except the area within the trench.

The CMP step also removes a top portion of copper-plated portions 7, thereby resulting in a pair of conductive interconnects 11 disposed on respective sides of an MIM capacitor formed from a bottom plate 4, an upper plate 10, and in intervening dielectric layer 8. The CMP process is also controlled so that the conductive interconnects and the capacitor not only have even upper surfaces, but also to ensure that the capacitor and interconnects have a desired height. Because the bottom plate of the capacitor is partially formed on the sidewalls of the trench, the amount of material removed during the CMP step will necessarily affect the capacitance of the capacitor. This is taken into consideration during the CMP step to produce a capacitor with a desired capacitance.

The CMP step is very desirable because it provides a smooth, planarized top surface which improves capacitor performance. General principles of copper damascene interconnect and dielectric CMP are known. Polishing slurries for copper are commonly a mixture of fine particles of alumina or silica and proprietary chemicals to control the oxidation of copper during polishing. Optimal conditions for polishing copper and dielectric are usually different. Variables such as the polishing slurries, pads, applied pressure and rotation speed of the pad have to be optimized to achieve good planarity and high polishing rates. It is important to remove any residual metal over the capacitor dielectric to avoid electrical short between the lower and upper electrode.

In accordance with the preferred embodiment of the present invention, this is the only chemical polishing that is performed during formation of the capacitor. Performing only one CMP step is an especially advantageous feature of the invention, as conventional methods require multiple polishing steps which degrade manufacturing efficiency. Further, the single CMP step of the invention finishes not only the capacitor but also simultaneously finishes the conductive interconnects (i.e., wiring) used to connect the capacitor to other layers or elements of the device. While the method of the invention is preferably practiced with only one CMP step, those skilled in the art can appreciate that more than one CMP step may be performed if desired.

As a result the foregoing steps, an MIM capacitor is formed with an open-box shape. This shape is highly desirable because it has proven to have higher capacitance efficiency than conventional designs. For example, conventional designs such as disclosed in U.S. Pat. No. 6,144,051 use a planar parallel plate capacitor design. U.S. Pat. No. 6,159,793 discloses a stack capacitor based on formation of hemispherical grain polysilicon surface of a crown shaped amorphous silicon layer, followed by selective tungsten deposition resulting in a rough surface bottom electrode. The box shape and rough lower electrode surface of the present invention produces larger surface area and hence higher capacitance than both of these conventional designs.

The method of the present invention is also highly desirable because forms the MIM capacitor and the copper wiring/interconnects simultaneously. This results in a substantial reduction in process time and associated costs. The method also forms the copper wiring/interconnects at the same level as the capacitor. This increases integration density along with the damascene structure of the capacitor. Still further, improved performance in of the capacitor is realized by coupling this damascene structure with the use of a copper barrier and seed layer as the bottom electrode of the capacitor. Specifically, by coupling these features, low sheet resistance, improved planarity/surface roughness, and an enhanced capacity to store an electric charge are realized.

In an alternative embodiment, instead of a rectangular or square box, the capacitor of the present invention may be made as a cylinder or a polyhedron, as shown in FIGS. 8(a)–(d). A polyhydron capacitor has a much larger surface area and hence a larger capacitance per unit substrate area. As shown, the alternative shapes of the capacitor may include a 5-point and a 24-point star polyhedron.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. A method for making a structure including a metal-insulator-metal capacitor, comprising the steps of:

providing an inter-level dielectric layer;

forming a damascene pattern on a surface of said inter-level dielectric layer, said damascene pattern including a trench and at least one via adjacent said trench;

depositing a copper barrier and seed layer over said inter-level dielectric layer and in contact with said inter-level dielectric layer at a bottom of said trench and at a bottom of said via, so that said copper barrier and seed layer is formed on both the bottom and sidewalls of said trench and within said via;

forming a resist pattern over said trench;

filling said via with copper in contact with said copper barrier and seed layer to form a conductive interconnect;

removing the resist pattern over said trench;

forming a dielectric over said copper barrier and seed layer within the trench and in contact with said copper barrier and seed layer within the trench; and forming a metal layer over said dielectric and in contact therewith, wherein said copper barrier and seed layer forms a bottom plate of said capacitor, said dielectric forms a dielectric of said capacitor, and said metal layer forms an upper plate of said capacitor.

2. The method of claim 1, wherein said steps of forming said dielectric over said copper barrier and seed layer and forming said metal layer over said dielectric are performed after said removing step, and said conductive interconnect is formed simultaneously with said capacitor.

3. The method of claim 2, further comprising:

planarizing at least said metal layer and said dielectric so that a top surface of said capacitor and a top surface of said conductive interconnect are even.

4. The method of claim 3, wherein said planarizing step is performed so that said capacitor and said conductive interconnect have a predetermined height.

5. The method of claim 3, wherein said planarizing step is performed in accordance with a chemical mechanical polishing (CMP) process.

6. The method of claim 5, wherein said CMP process is performed only once during simultaneous formation of said capacitor and said conductive interconnect.

7. The method of claim 1, wherein said conductive interconnect is formed using a plate-through mask technique.

8. The method of claim 1, wherein the dielectric, the upper plate and the bottom plate of said capacitor have an open-box shape within said trench.

* * * * *